United States Patent
Helbing

(10) Patent No.: US 8,247,827 B2
(45) Date of Patent: Aug. 21, 2012

(54) LED PHOSPHOR DEPOSITION

(75) Inventor: Rene Peter Helbing, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 64 days.

(21) Appl. No.: 12/242,274

(22) Filed: Sep. 30, 2008

(65) Prior Publication Data

US 2010/0078664 A1  Apr. 1, 2010

(51) Int. Cl.
*H01L 33/00* (2010.01)
*H01L 23/02* (2006.01)
*H01L 21/00* (2006.01)
*H01L 21/44* (2006.01)
*H01L 21/48* (2006.01)
*H01L 21/50* (2006.01)

(52) U.S. Cl. .......... 257/98; 257/680; 257/E33.059; 438/26; 438/116

(58) Field of Classification Search .......... 257/98, 257/680, E33.059; 438/26, 116
See application file for complete search history.

(56) References Cited

U.S. PATENT DOCUMENTS

| | | | |
|---|---|---|---|
| 4,961,886 A | | 10/1990 | Eckstein et al. |
| 5,962,810 A | * | 10/1999 | Glenn ........................ 174/524 |
| 6,295,699 B1 | | 10/2001 | Temburg |
| 6,595,699 B1 | * | 7/2003 | Nguyen et al. .................. 385/88 |
| 6,914,267 B2 | | 7/2005 | Fukasawa et al. |
| 7,064,424 B2 | * | 6/2006 | Wilson ........................... 257/680 |
| 2002/0033913 A1 | | 3/2002 | Melnick et al. |
| 2003/0062518 A1 | | 4/2003 | Auch et al. |
| 2007/0096129 A1 | * | 5/2007 | Park ................................ 257/98 |
| 2007/0170454 A1 | * | 7/2007 | Andrews ....................... 257/100 |
| 2008/0099139 A1 | * | 5/2008 | Miyoshi et al. ............... 156/291 |
| 2008/0121922 A1 | * | 5/2008 | Chen ............................... 257/99 |
| 2008/0265271 A1 | * | 10/2008 | Biar et al. ....................... 257/99 |
| 2009/0014736 A1 | * | 1/2009 | Ibbetson et al. ................ 257/98 |

FOREIGN PATENT DOCUMENTS

EP  1914809 A1 * 4/2008

OTHER PUBLICATIONS

Search Report of Nov. 19, 2009 for PCT/US09/58079.

* cited by examiner

*Primary Examiner* — David S Blum

(57) ABSTRACT

LED phosphor deposition for use with LEDs. In an aspect, a method is provided for forming an encapsulation. The method includes determining a geometric shape for the encapsulation, selecting a dam material, applying the dam material to a substrate to form a boundary defining a region having the geometric shape, and filling the region with encapsulation material to form the encapsulation. In another aspect, an LED apparatus is provided that includes at least one LED chip and an encapsulation disposed on the at least one LED chip. The encapsulation is formed by determining a geometric shape for the encapsulation, selecting a dam material, applying the dam material to a substrate to form a boundary defining a region having the geometric shape, and filling the region with encapsulation material to form the encapsulation.

11 Claims, 3 Drawing Sheets

LED PHOSPHOR DEPOSITION

BACKGROUND

1. Field

The present application relates generally to light emitting diodes, and more particularly, to a phosphor deposition system to form encapsulations for light emitting diodes.

2. Background

A light emitting diode (LED) is a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, and is referred to either as an n-type or p-type semiconductor region, respectively. In LED applications, the semiconductor includes an n-type semiconductor region and a p-type semiconductor region. A reverse electric field is created at the junction between the two regions, which cause the electrons and holes to move away from the junction to form an active region. When a forward voltage sufficient to overcome the reverse electric field is applied across the p-n junction, electrons and holes are forced into the active region and combine. When electrons combine with holes, they fall to lower energy levels and release energy in the form of light.

During operation, a forward voltage is applied across the p-n junction through a pair of electrodes. The electrodes are formed on the semiconductor material with a p-electrode formed on the p-type semiconductor region and an n-electrode formed on the n-type semiconductor region. Each electrode includes a wire bond pad that allows an external voltage to be applied to the LED.

Generally, an LED device comprises an LED chip (or die) that is mounted onto a substrate and encapsulated with an encapsulation material, such as phosphor. The encapsulation operates to protect the LED chip and to extract light. Typically, the LED chip sits in a cavity, which is then filled with the encapsulation material. For LED chips mounted on flat substrates (e.g. Chip on board), there is no cavity and the procedure has to be different. To provide for an encapsulation having a specific geometric shape, an encapsulation mold having the desired geometric shape is separately designed and manufactured. The mold is then mounted onto the substrate so that it fits around the LED chip. The mold is then filled with the phosphor mixture or other encapsulation material.

Unfortunately, using a separately designed and manufactured mold is costly, time consuming, and requires additional manufacturing operations. For example, the mold needs to be designed and fabricated as a separate part, which is time consuming and costly. The mold then needs to be mounted onto the substrate before it can be filled with the encapsulation material, which requires additional manufacturing operations.

Accordingly, there is a need in the art for improvements in encapsulation technology so that encapsulations having a variety of shapes can be formed quickly and flexibility to reduce costs and simplify the manufacture of LED devices.

SUMMARY

In various aspects, a phosphor deposition system is provided that allows LED encapsulations having a variety of geometries to be formed in a fast, flexible, and cost effective manner with simple manufacturing operations.

In an aspect, a method is provided for forming an encapsulation. The method comprises determining a geometric shape for the encapsulation, selecting a dam material, applying the dam material to a substrate to form a boundary defining a region having the geometric shape, and filling the region with encapsulation material to form the encapsulation.

In another aspect, an LED apparatus is provided that comprises at least one LED chip and an encapsulation disposed on the at least one LED chip. The encapsulation is formed by determining a geometric shape for the encapsulation, selecting a dam material, applying the dam material to a substrate to form a boundary defining a region having the geometric shape, and filling the region with encapsulation material to form the encapsulation.

In another aspect, an LED lamp is provided that comprises a package and an LED apparatus coupled to the package. The LED apparatus comprises at least one LED chip and an encapsulation disposed on the at least one LED chip. The encapsulation is formed by determining a geometric shape for the encapsulation, selecting a dam material, applying the dam material to a substrate to form a boundary defining a region having the geometric shape, and filling the region with encapsulation material to form the encapsulation It is understood that other aspects of the present invention will become readily apparent to those skilled in the art from the following detailed description. As will be realized, the present invention includes other and different aspects and its several details are capable of modification in various other respects, all without departing from the spirit and scope of the present invention. Accordingly, the drawings and the detailed description are to be regarded as illustrative in nature and not as restrictive.

BRIEF DESCRIPTION OF THE DRAWINGS

The foregoing aspects described herein will become more readily apparent by reference to the following Description when taken in conjunction with the accompanying drawings wherein.

DESCRIPTION

Figure 1:
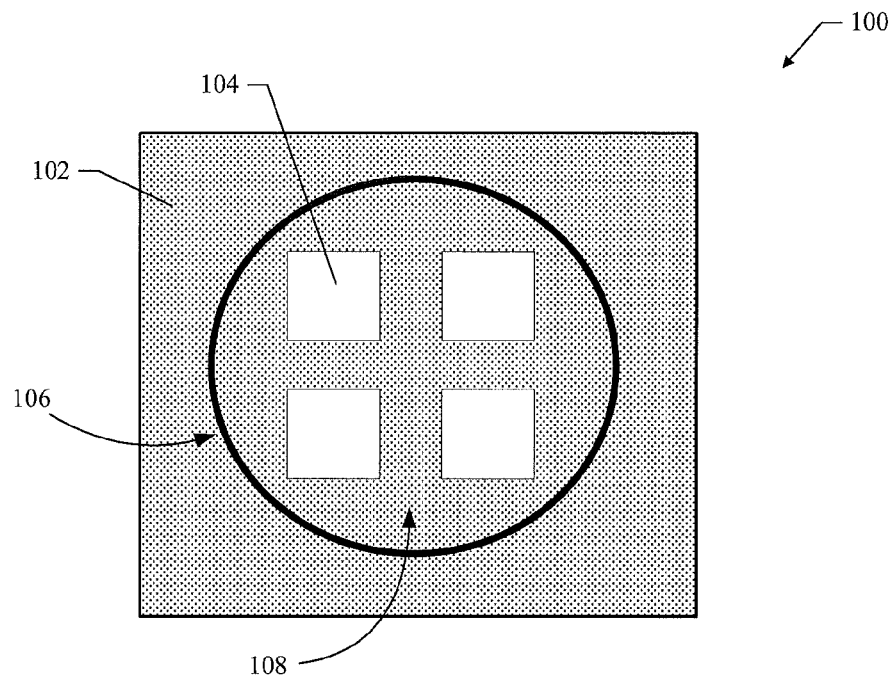
FIG. 1 shows an exemplary LED assembly that illustrates aspects of a phosphor deposition system.

The present invention is described more fully hereinafter with reference to the accompanying drawings, in which various aspects of the present invention are shown. This invention may, however, be embodied in many different forms and should not be construed as limited to the various aspects of the present invention presented throughout this disclosure. Rather, these aspects are provided so that this disclosure will be thorough and complete, and will fully convey the scope of the present invention to those skilled in the art. The various aspects of the present invention illustrated in the drawings may not be drawn to scale. Accordingly, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Referring now to FIG. 1, an exemplary LED assembly 100 is shown that illustrates aspects of a phosphor deposition system. The LED assembly 100 comprises a plurality of LED chips 104 mounted on a substrate 102 that may be ceramic, aluminum or any other suitable substrate material. It should be noted that although four LED chips 104 are shown in FIG. 1, the system is suitable for use with one or any number of LED chips.

In accordance with aspects of the system described herein, a dam 106 comprising dam material is deposited onto the substrate 102 so that it surrounds the LED chips 104 so as to create an encapsulation region 108. The dam material may be clear or an opaque white that is reflective. For example, the dam material can be epoxy or silicone. In an aspect, filler particles like titanium dioxide can be added to create an opaque material. In general the dam material should be transparent or reflective. In an aspect, the dam material is deposited onto the substrate 102 by an automated dispenser machine that is programmable and is able to deposit the dam material onto the substrate 102 in any pattern and/or geometric shape. For example, dam material may be deposited to form rectangular shapes, circular shapes, curved shapes and/or any combination of shapes that may be selected to define a region in which an encapsulation is to be formed. The dam material may also be deposited with a desired cross-section.

In another aspect, the deposited dam material has different optical properties. For example, in an aspect, the dam material comprises a reflective dam material that reflects light. Thus, light emitted from the LED chips 104 will be reflected from the dam material to form a narrower radiation pattern. In another aspect, the dam material comprises a transparent dam material that passes light. Thus, light emitted from the LED chips 104 will pass through the dam material to form a broader radiation pattern. A more detailed description of how the system provides various radiation patterns is provided in another section of this document. Therefore, in various aspects, different dam materials can be selected so as to obtain an encapsulation having different radiation patterns.

Therefore, in various aspects, an efficient phosphor deposition system is provided for simplified encapsulation formation, selectable light radiation patterns, and other benefits. The system is suitable for use with any type of substrate and has the following features.

1. Free form, easy to deposit, and easy to shape dam material to provide any type of encapsulation geometry.
2. Dam material may be transparent (i.e., clear silicone) to pass light to obtain a broad radiation pattern.
3. Dam material may be reflective to reflect light to obtain a narrower radiation pattern.
4. Dam material can be deposited with a range of heights and cross-sections.
5. Dam material can be applied to any type of substrate material.
6. Avoids expensive and time consuming design, manufacture, and assembly of pre-manufactured molds.

Figure 2:
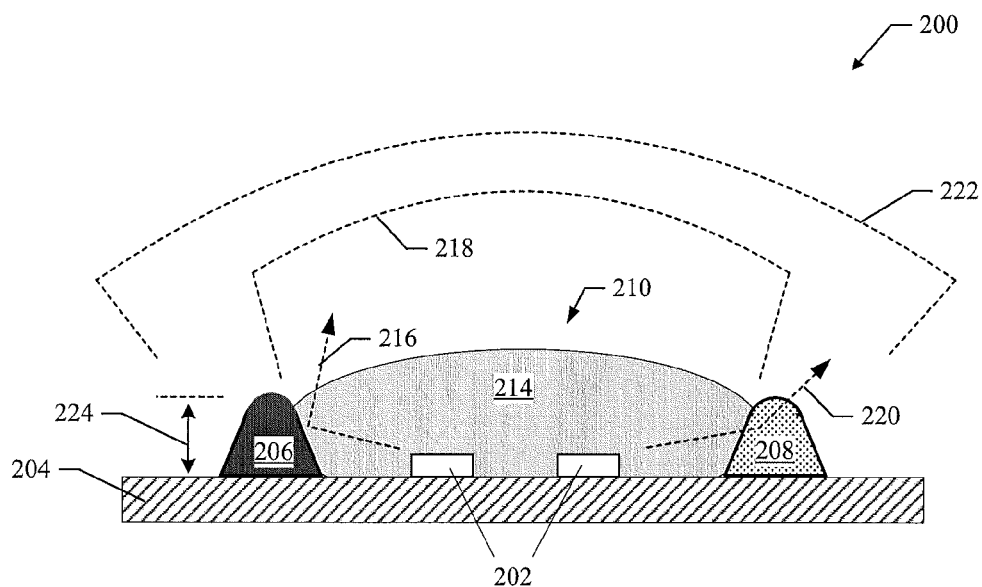
FIG. 2 shows an exemplary LED assembly that illustrates aspects of a phosphor deposition system.

FIG. 2 shows an exemplary LED assembly 200 that illustrates aspects of a phosphor deposition system. The LED assembly 200 comprises a plurality of LED chips 202 mounted onto a substrate 204. In accordance with the various aspects, the dam material (shown at 206 and 208) is deposited onto the substrate 204 to define a closed region generally indicated at 210, in which an encapsulation is to be formed. For example, the dam material that is shown at 206 and 208 forms a boundary that defines the closed region 210. For the purpose of this description the dam material is shown in the two sections 206 and 208 to illustrate how the optical characteristics of the dam material can be selected to obtain a desired radiation pattern. It should also be noted that the dam material can be deposited to have virtually any cross-section and is not limited to the cross-section shape shown in FIG. 2.

The dam material shown at 206 and 208 is deposited onto the substrate 204 with a selected height shown at 224. After the dam material is deposited, an encapsulation 214 is formed by filling the region 210 defined by the dam material (206, 208) with encapsulation material. Thus, the dam material can be deposited onto the substrate to define any size and/or shaped region in which a corresponding size/shaped encapsulation can be formed.

For the purpose of illustrating how the dam material can be selected to obtain broad and narrow radiation patterns, it will be assumed that the dam material is selected to be a reflective material. The dam material 206 illustrates optical characteristics under this assumption. If the dam material is selected to be reflective, light emitted from the LEDs 202 reflects off the surface of the dam material as illustrated at 216 to form a narrow radiation pattern illustrated at 218.

Assuming now that the dam material is selected to be transparent. The dam material 208 illustrates optical characteristics under this assumption. If the dam material is selected to be transparent, light emitted from the LEDs 202 passes through the dam material as illustrated at 220 to form a broad radiation pattern illustrated at 222. Thus, in various aspects, dam material may be selected to obtain a desired radiation pattern.

The indicator 224 illustrates the height of the dam material. In various aspects, dam material may be deposited to have a wide range of heights and/or cross-sections. For example, dam material having a height of approximately one millimeter can be easily achieved. Generally, the height and/or cross-section of the dam material may be dependant on the width of its base or on overall aspect ratio.

Figure 3:
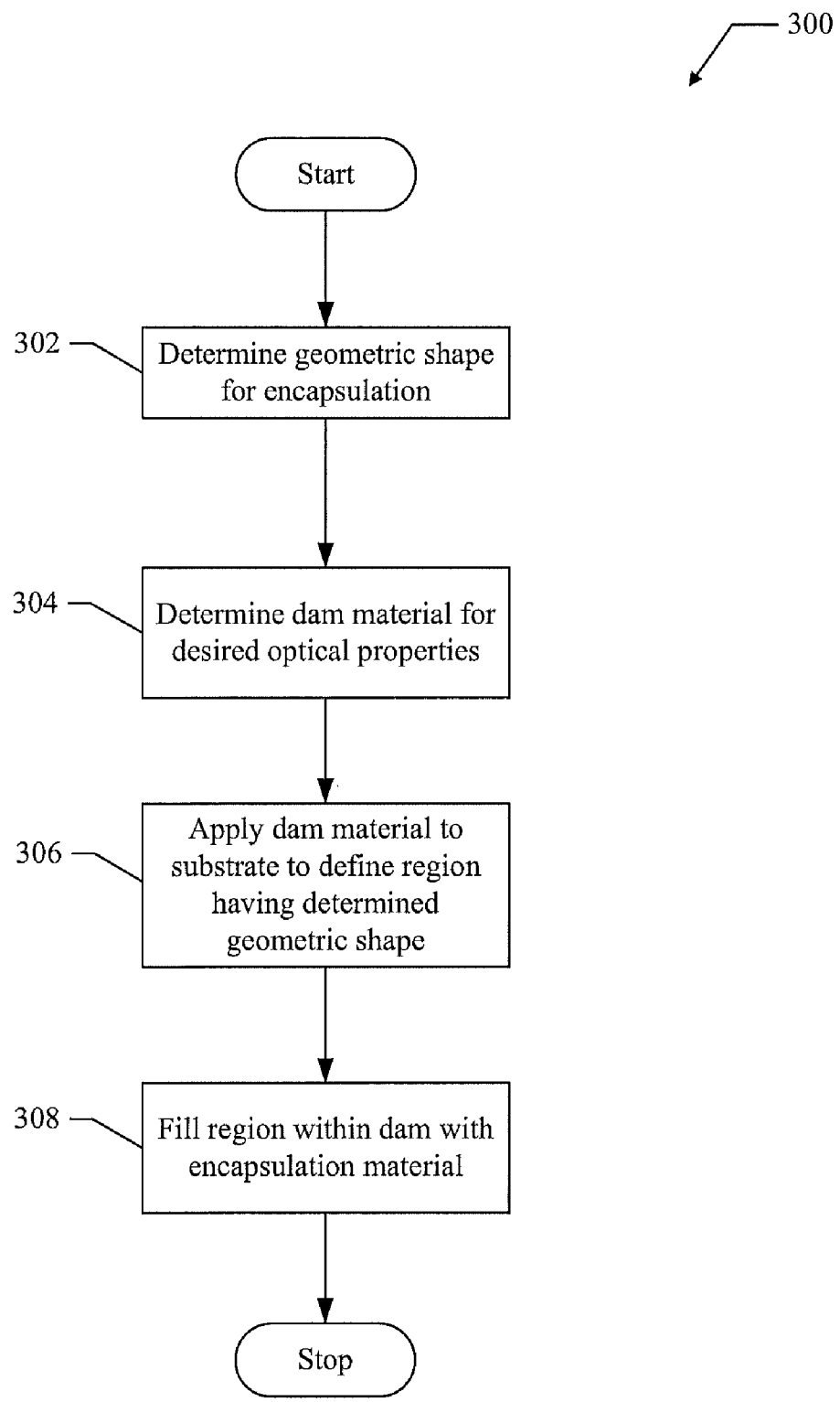
FIG. 3 shows an exemplary method for providing encapsulations in accordance with a phosphor deposition system.

FIG. 3 shows an exemplary method 300 for providing encapsulations in accordance with a phosphor deposition system. For clarity, the method 300 is described below with reference to FIGS. 1-2.

At block 302, a geometric shape is determined for an encapsulation to be used with an LED assembly. In an aspect, any suitable geometric shape may be selected. For example, rectangular shapes, circular shapes, curved shapes and/or any combination of shapes may be selected.

At block 304, a dam material is selected to provide a desired optical radiation pattern. In an aspect, the dam material may be reflective material that reflects light to provide a narrower radiation pattern. In another aspect, the dam material may be transparent to pass light to provide a broad radiation pattern.

At block 306, the dam material is deposited onto the substrate to form a boundary that defines a region having the desired geometric shape. It should be noted that multiple regions may be defined. In an aspect, the dam material is deposited by an automated dispenser. The dam material may also be deposited at a desired height above the substrate and with a desired cross-section to further define the shape of the encapsulation. For example, as illustrated in FIG. 1, the dam material is deposited to form the region 108, and in FIG. 2, the dam material is deposited to form the region 210.

At block 308, the region bounded by the dam material is filled with encapsulation material to obtain an encapsulation have the desired shape. For example, the encapsulation material may be a silicone or epoxy, either clear or filled with phosphor, or any other encapsulation material that is applied, deposited, or otherwise filled within the regions bounded by the dam material.

Therefore, the method 300 operates to provide a phosphor deposition system that allows encapsulations having a variety of shapes to be quickly and flexibly formed. It should be noted that the operations of the method 300 may be rearranged or otherwise modified within the scope of the various aspects. Thus, other implementations are possible with the scope of the various aspects described herein.

Figure 4:
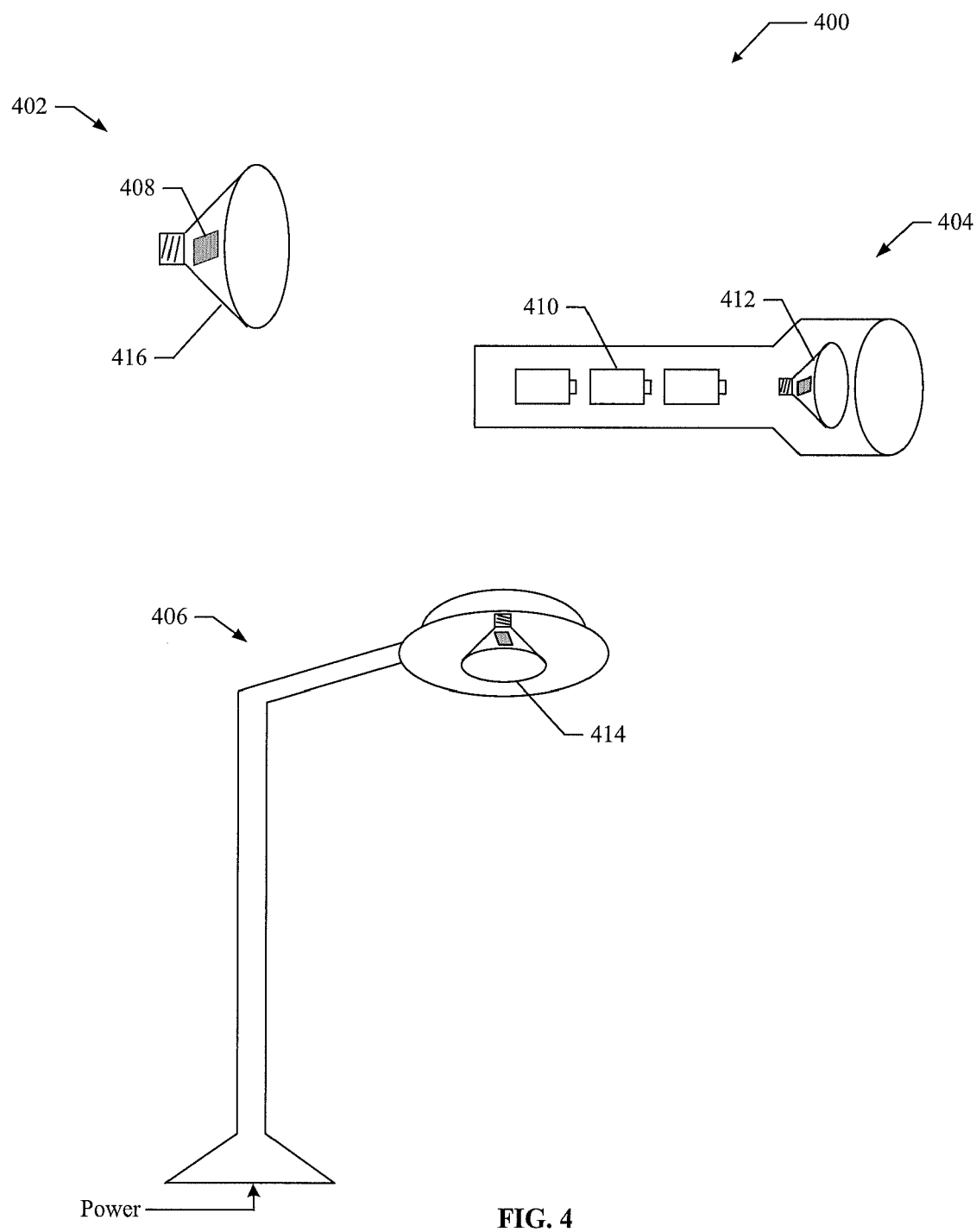
FIG. 4 shows exemplary devices comprising LED assemblies constructed in accordance with a phosphor deposition system.

FIG. 4 shows exemplary devices 400 comprising LED assemblies 408 having encapsulations formed by a phosphor deposition system in accordance with aspects of the present invention. The devices 400 comprise a lamp 402, an illumination device 404, and a street light 406. Each of the devices shown in FIG. 4 includes an LED assembly 408 having an encapsulation formed by a phosphor deposition system as described herein. For example, the lamp 402 comprises a package 416 and an LED assembly 408 having an encapsulation formed by a phosphor deposition system. The lamp 402 may be used for any type of general illumination. For example, the lamp 402 may be used in an automobile headlamp, street light, overhead light, or in any other general illumination application. The illumination device 404 comprises a power source 410 that is electrically coupled to a lamp 412, which may be configured as the lamp 402. In an aspect, the power source 410 may be batteries or any other suitable type of power source, such as a solar cell. The street light 406 comprises a power source connected to a lamp 414, which may be configured as the lamp 402. In an aspect, the lamp 414 comprises an LED assembly 408 having an encapsulation formed by a phosphor deposition system.

It should be noted that aspects of the phosphor deposition system described herein are suitable for use to form encapsulations for use with virtually any type of LED assembly, which in turn may be used in any type of illumination device and are not limited to the devices shown in FIG. 4.

The various aspects of this disclosure are provided to enable one of ordinary skill in the art to practice the present invention. Various modifications to aspects presented throughout this disclosure will be readily apparent to those skilled in the art, and the concepts disclosed herein may be extended to other applications. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims.

Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

Accordingly, while aspects of a phosphor deposition system have been illustrated and described herein, it will be appreciated that various changes can be made to the aspects without departing from their spirit or essential characteristics. Therefore, the disclosures and descriptions herein are intended to be illustrative, but not limiting, of the scope of the invention, which is set forth in the following claims.

What is claimed is:

1. A method for forming an encapsulation for a light emitting diode (LED), the method comprising:
   applying a transparent dam material onto a substrate to form a boundary defining a region;
   filling the region with encapsulation material; and
   wherein the dam material is configured to refract light to provide a broader emitted light pattern than would a reflective dam material.

2. The method of claim 1, wherein said applying comprises applying the dam material so that it has at least one of a selected cross-section and a selected height above the substrate.

3. The method of claim 1, wherein said selecting comprises selecting one of silicone or epoxy as the dam material.

4. The method of claim 1, wherein said applying comprises applying the dam material with an automated dispenser.

5. A light emitting diode (LED) apparatus comprising:
   at least one LED chip; and
   an encapsulation disposed on the at least one LED chip, wherein the encapsulation is formed by:
      applying a transparent dam material onto a substrate to form a boundary defining a region;
      filling the region with encapsulation material; and
      wherein the dam material is configured to refract light to provide a broader emitted light pattern than would a reflective dam material.

6. The apparatus of claim 5, wherein said applying comprises applying the dam material so that it has at least one of a selected cross-section and a selected height above the substrate.

7. The apparatus of claim 5, wherein said selecting comprises selecting one of silicone or epoxy as the dam material.

8. The apparatus of claim 5, wherein said applying comprises applying the dam material with an automated dispenser.

9. A light emitting diode (LED) lamp comprising:
   a package;
   a light emitting diode apparatus coupled to the package and comprising:
   at least one LED chip and an encapsulation disposed on the at least one LED chip, wherein the encapsulation is formed by:
      applying a transparent dam material onto a substrate to form a boundary defining a region;
      filling the region with encapsulation material; and
      wherein the dam material is configured to refract light to provide a broader emitted light pattern than would a reflective dam material.

10. The lamp of claim 9, wherein said applying comprises applying the dam material so that it has at least one of a selected cross-section and a selected height above the substrate.

11. The lamp of claim 9, wherein said selecting comprises selecting one of silicone or epoxy as the dam material.

* * * * *